United States Patent
Lee

(10) Patent No.: US 8,060,233 B2
(45) Date of Patent: Nov. 15, 2011

(54) CONTROL SYSTEM FOR A PLURALITY OF CHIP MOUNTERS AND OPERATING METHOD THEREOF

(75) Inventor: Je-pil Lee, Seongnam-si (KR)

(73) Assignee: Samsung Techwin Co., Ltd., Changwon (KR)

( * ) Notice: Subject to any disclaimer, the term of this patent is extended or adjusted under 35 U.S.C. 154(b) by 181 days.

(21) Appl. No.: 11/825,965

(22) Filed: Jul. 10, 2007

(65) Prior Publication Data
US 2008/0221723 A1 Sep. 11, 2008

(30) Foreign Application Priority Data
Mar. 6, 2007 (KR) .......................... 10-2007-0021958

(51) Int. Cl.
G06F 19/00 (2011.01)
G06F 17/00 (2006.01)
G05B 19/18 (2006.01)
B23P 19/00 (2006.01)

(52) U.S. Cl. ............ 700/121; 700/90; 700/95; 700/110; 700/114; 700/57; 700/112; 29/739; 29/740

(58) Field of Classification Search .................. 700/121, 700/95, 90, 110, 112, 114, 57; 29/739, 740
See application file for complete search history.

(56) References Cited

U.S. PATENT DOCUMENTS

| 4,845,843 | A * | 7/1989 | Babcock ........................ 29/829 |
| 5,237,508 | A * | 8/1993 | Furukawa et al. ............ 700/100 |
| 6,322,854 | B1 * | 11/2001 | Purcell et al. .................... 427/10 |
| 6,359,646 | B1 * | 3/2002 | Kanauchi ......................... 348/87 |
| 7,251,541 | B2 * | 7/2007 | Shimizu ......................... 700/121 |
| 7,315,766 | B2 * | 1/2008 | Chikuma et al. .............. 700/121 |
| 7,440,812 | B2 * | 10/2008 | Yano et al. ..................... 700/108 |
| 2001/0027877 | A1 * | 10/2001 | Kuribayashi et al. ......... 174/260 |
| 2001/0032030 | A1 * | 10/2001 | Nakahara et al. ............. 700/114 |
| 2003/0227239 | A1 * | 12/2003 | Wang et al. ................. 312/257.1 |
| 2003/0230838 | A1 * | 12/2003 | Cho et al. .................. 269/289 R |
| 2004/0188642 | A1 * | 9/2004 | Kodama et al. .......... 250/559.29 |

(Continued)

FOREIGN PATENT DOCUMENTS
CN 1729736 A 2/2006
(Continued)

OTHER PUBLICATIONS

Office Action established for CN 200710148332.4 (Jun. 15, 2011).

*Primary Examiner* — Albert Decady
*Assistant Examiner* — Jason Lin
(74) *Attorney, Agent, or Firm* — Drinker Biddle & Reath LLP

(57) ABSTRACT

A control system includes at least one part mounter installing parts on a printed circuit board and a control device integrally controlling the operation of the at least one part mounter. The control device controls the part mounter using information about the printed circuit board and information on a production process flow of the printed circuit board. The control device integrally controls the operations of the part mounters, including receiving and storing information on parts that the part mounters install, information on a feeder that supplies the parts, and information on arrangement of the parts on the printed circuit board, receiving and displaying operation information and operation situations from the part mounters, and controlling operations of the part mounters using the stored information and displayed information.

19 Claims, 8 Drawing Sheets

U.S. PATENT DOCUMENTS

2006/0011645 A1 * 1/2006 Shimada ..................... 221/121

FOREIGN PATENT DOCUMENTS

| | | | | |
|---|---|---|---|---|
| JP | 04108000 | A | * | 4/1992 |
| JP | 07-136876 | A | | 5/1995 |
| JP | 09298396 | A | * | 11/1997 |
| JP | 2002335099 | A | * | 11/2002 |
| JP | 2003-243900 | A | | 8/2003 |
| KR | 1998-064407 | A | | 10/1998 |
| KR | 1998-0075370 | A | | 11/1998 |

* cited by examiner

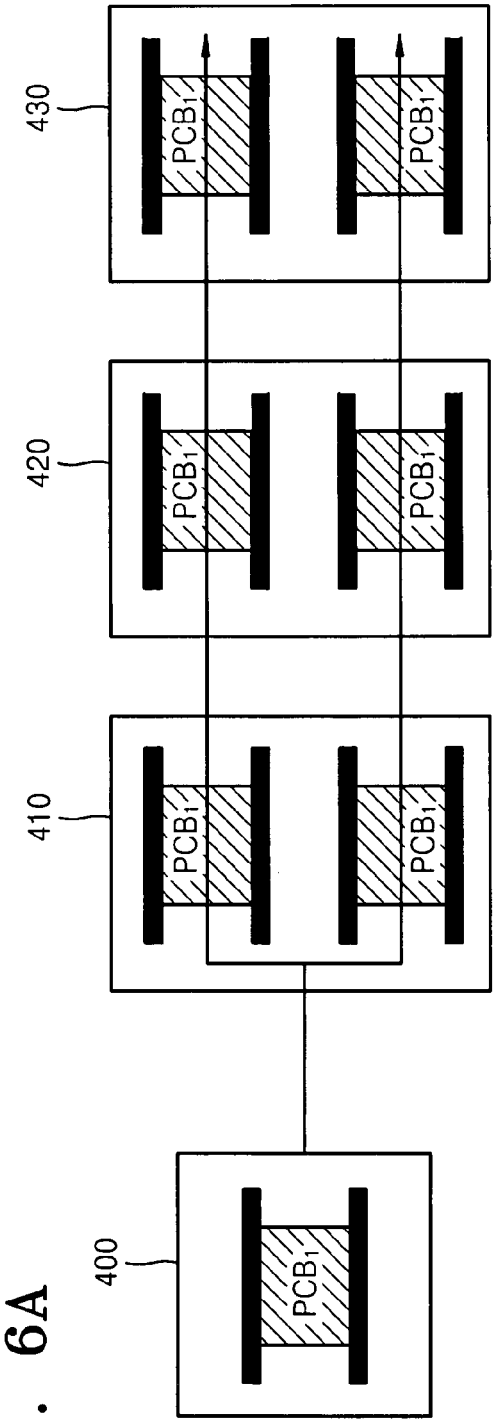
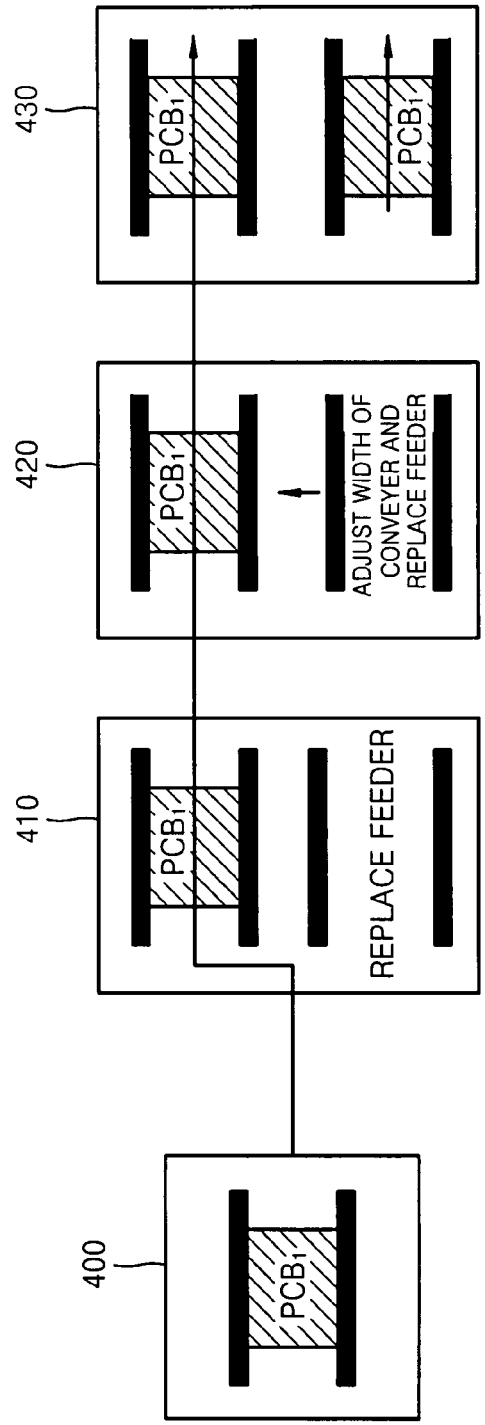
FIG. 6A
FIG. 6B

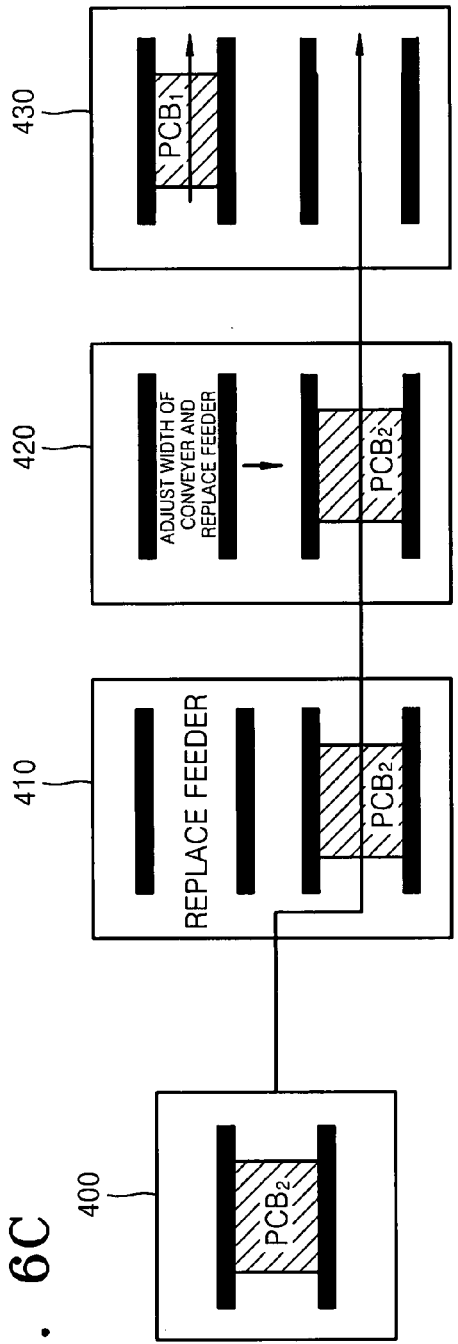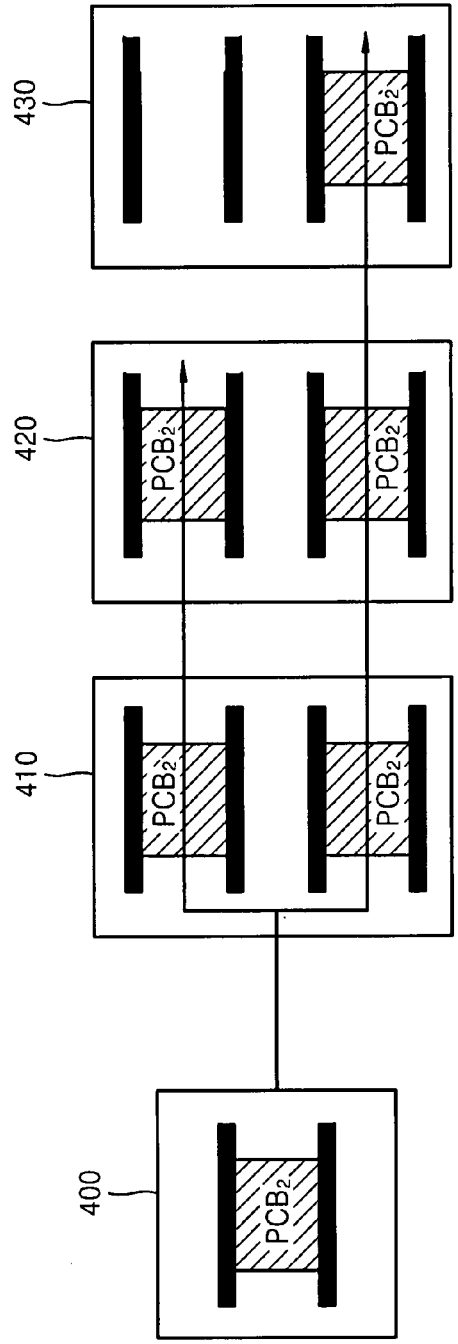
FIG. 6C
FIG. 6D

CONTROL SYSTEM FOR A PLURALITY OF CHIP MOUNTERS AND OPERATING METHOD THEREOF

CROSS-REFERENCE TO RELATED PATENT APPLICATIONS

This application claims the benefit of Korean Patent Application No. 10-2007-0021958, filed on Mar. 6, 2007, in the Korean Intellectual Property Office, the disclosure of which is incorporated herein in its entirety by reference.

BACKGROUND OF THE INVENTION

1. Field of the Invention

The present invention relates to a system integrally controlling a plurality of chip mounters that are independently operated, and an operating method thereof.

2. Description of the Related Art

Surface mount technology (SMT) generally refers to printing solder paste on a printed circuit board (PCB), installing various surface mount devices (SMD) using mounting equipment, and connecting the PCB and leads of the SMDs using a reflow device.

FIG. 1 is a perspective view illustrating the configuration of a general SMT line system. A loader 110 is a device to automatically supply a PCB such as from a magazine. A screen printer 120 is a device to coat solder paste at part installation positions on the surface of the PCB that is supplied by the loader 110. A chip mounter 130 is a device to arrange and fix various parts and chips at a location on the PCB where the solder paste is coated. The chip mounter 130 may include at least one chip mounter, that is, there may be a plurality of chip mounters 131, 132, and 133, according to the structure thereof.

Although it is not shown in the drawing, each of the chip mounters 131, 132, and 133 includes a part feeder, a head unit, a suction nozzle, and a camera. First, the suction nozzle of the head unit sucks and picks up a part from the part feeder. To accurately check the suction state and the center position of a part, the head unit moves over the camera, which checks the suction state and the center position of the part. When the check is complete, the part is rotated at an accurate angle to the correct installation position and installed on the PCB.

The reflow oven 140 heats and melts the solder paste under the parts, which were installed on the PCB by the chip mounter 130, and fixes the parts on the PCB through a cooling process. The unloader 150 unloads and accommodates each complete PCB.

As described above, the PCB is produced through the SMT line system shown in FIG. 1. FIG. 2 illustrates the detailed configuration of a control module of the chip mounter 130 of the SMT line system. As shown in FIG. 2, each of the chip mounters 131, 132, and 133 includes a mounting driving unit 134, a user interface (I/F) 138 having a database 137 containing part related data, and a display 139. The mounting driving unit 134 includes a mechanical module 135 and a control unit 136 controlling the mechanical module 135.

Each chip mounter 131, 132, or 133 is independently operated according to the types of parts to be installed or according to whether the parts are to be installed on a single side PCB or a double-sided PCB. To operate the chip mounters 131, 132, and 133, while watching the display unit 139, an operator inputs a work order to the control unit 136 through the user interface 138. Then, the control unit 136 operates the mechanical module 135 according to the work order input by the operator.

When the SMT line system includes three chip mounters as shown in FIG. 1, an operator separately operates each chip mounter to perform an individual work order because each chip mounter operates independently. Thus, when an error occurs in any one chip mounter, the other chip mounters cannot recognize the problem.

Furthermore, when a job change situation occurs, e.g., when the present work order is completed and a new work order is to begin, the operations of all three chip mounters are stopped and the operator accesses each chip mounter and inputs individual new work orders to re-operate the three chip mounters. Thus, a lot of work preparation time is needed so that productivity deteriorates.

SUMMARY OF THE INVENTION

To solve the above and/or other problems, the present invention provides a control system and operating method for a plurality of chip mounters. The control system can integrally control the chip mounters, which are otherwise independently operated, by using a single device so that the chip mounters are efficiently managed and productivity is improved.

Also, the present invention provides a control system and operating method of a plurality of chip mounters which adds an additional function to control all of the chip mounters according to any one of the chip mounters, which are otherwise independently operated, so that the chip mounters are efficiently managed and productivity is improved.

According to an aspect of the present invention, a control system includes at least one part mounter installing different parts on the same printed circuit board and a control device integrally controlling the operation of the at least one part mounter, wherein the control device controls the at least one part mounter using information about a printed circuit board being processed by the part mounter and information about a production process flow of the printed circuit board.

The control system further includes a communication device performing data communication by connecting the at least one part mounter and the control device, either with a wire or wirelessly.

The part mounter includes a module operation portion performing a part mounting operation according to an operation command transmitted from the control device through the communication device. The control device includes a user interface for inputting a work order to the part mounter and for displaying the operation situation of the part mounter, a storing portion for storing information on parts installed by the part mounter, information on a feeder that supplies the parts, and information on arrangement of the parts on the printed circuit board, and a module operation control portion for controlling operation of the part mounter using information received through the user interface and the information stored in the storing portion.

The control device searches a first part mounter for a mark determining a reference point on the printed circuit board and a part installation position on the printed circuit board and supplies search information to the other part mounters.

The control device automatically arranges working parts in real time according to structural conditions and working conditions of the part mounter so that a bottle neck phenomenon such as due to a supply part depletion, a vision error, discontinuation of PCB supply, or a part mounter error may be avoided.

The control device provides a control so as to stop the installation of a part whose stock amount is insufficient on any one part mounter and then any one part mounter having a sufficient stock amount of the part installs the part.

The control device monitors a position of the printed circuit board provided in the part mounter to control positional movement of the printed circuit board.

The control device sets-up a next job on the part mounter performing a present job and controls the next job without stopping the part mounter when the present job of the part mounter is complete.

According to another aspect of the present invention, a control system includes at least one part mounter installing different parts on the same printed circuit board, wherein any one part mounter performs a role of a main part mounter controlling the other part mounters using information provided by the main part mounter about the printed circuit board and information on a production process flow of the printed circuit board.

The control system further includes a communication device performing data communication by connecting the part mounter and the control device with a wire or wirelessly.

The part mounter includes a module operation unit performing a part mounting operation according to an operation command transmitted from the main part mounter through the communication device, and a user interface inputting a work order to the part mounter and displaying the operation situation of the part mounter.

The main part mounter includes a user interface for inputting a work order to the part mounter and for displaying the operation situation of the part mounter, a storing portion storing information on parts installed by the part mounter, information on a feeder that supplies the parts, and information on arrangement of the parts on the printed circuit board, and a module operation control portion controlling operation of the part mounter using information received through the user interface and the information stored in the storing portion.

The main part mounter searches for a mark determining a reference point on the printed circuit board and a part installation position on the printed circuit board and provides the search information to the other part mounters.

The main part mounter automatically arranges working parts in real time according to structural conditions and working conditions of the part mounter so that a bottle neck phenomenon such as due to a supply part depletion, a vision error, discontinuation of PCB supply, or a part mounter error may be avoided.

The main part mounter provides a control so as to stop the installation of a part whose stock amount is insufficient on any one part mounter and then any one part mounter having a sufficient stock amount of the part installs the part.

The main part mounter monitors a position of the printed circuit board provided in the part mounter to control positional movement of the printed circuit board.

The main part mounter sets-up a next job on the part mounter performing a present job and controls the next job without stopping the part mounter when the present job of the part mounter is complete.

According to another aspect of the present invention, there is provided a method of integrally controlling operations of a plurality of part mounters installing parts on the same printed circuit board, using a control device that integrally controls the operations of the part mounters. The method includes receiving and storing information on parts that the part mounters install, information on a feeder that supplies the parts, and information on arrangement of the parts on the printed circuit board, receiving and displaying operation information and operation situations of the part mounters from the part mounters, and controlling operations of the part mounters using the stored information and displayed information.

According to another aspect of the present invention, there is provided a method of integrally controlling operations of a plurality of part mounters installing different parts on the same printed circuit board, and using any one of the part mounters to integrally control the operations of the other part mounters. The method includes receiving and storing information on parts that the part mounters install, information on a feeder that supplies the parts, and information on arrangement of the parts on the printed circuit board, receiving and displaying operation information and operation situations of the other part mounters from the other part mounters, and controlling operations of the respective part mounters using the stored information and displayed information.

BRIEF DESCRIPTION OF THE DRAWINGS

The above and other features and advantages of the present invention will become more apparent by describing in detail preferred embodiments thereof with reference to the attached drawings in which:

FIGS. 6A through 6D illustrate the job change operation of the chip mounter shown in FIGS. 3 and 4.

DETAILED DESCRIPTION OF THE INVENTION

Figure 1:
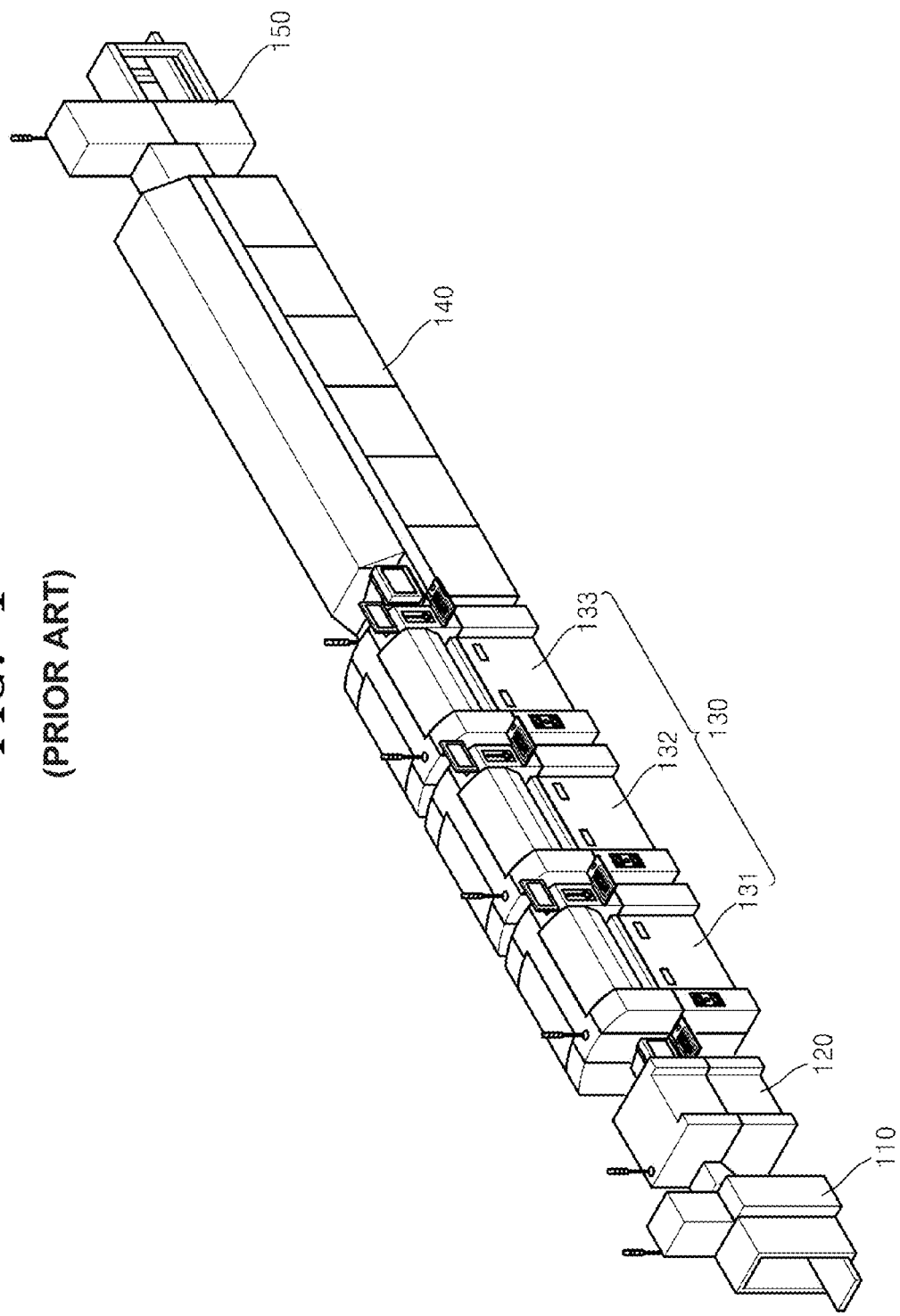
FIG. 1 is a perspective view illustrating the configuration of a general SMT line system.
Figure 2:
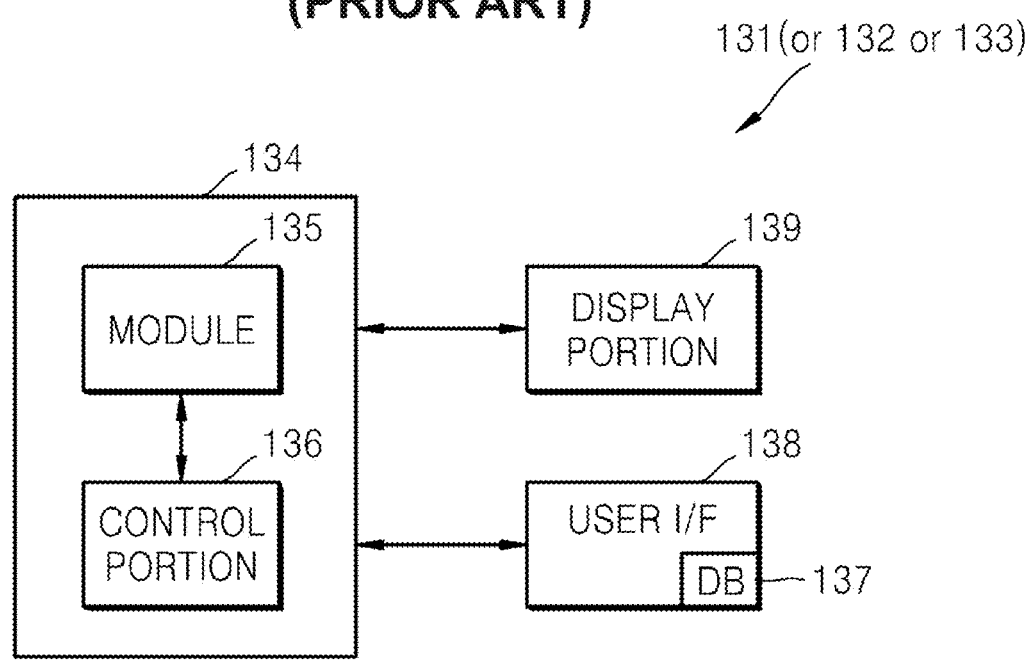
FIG. 2 is a block diagram of the chip mounter control module of FIG. 1.
Figure 3:
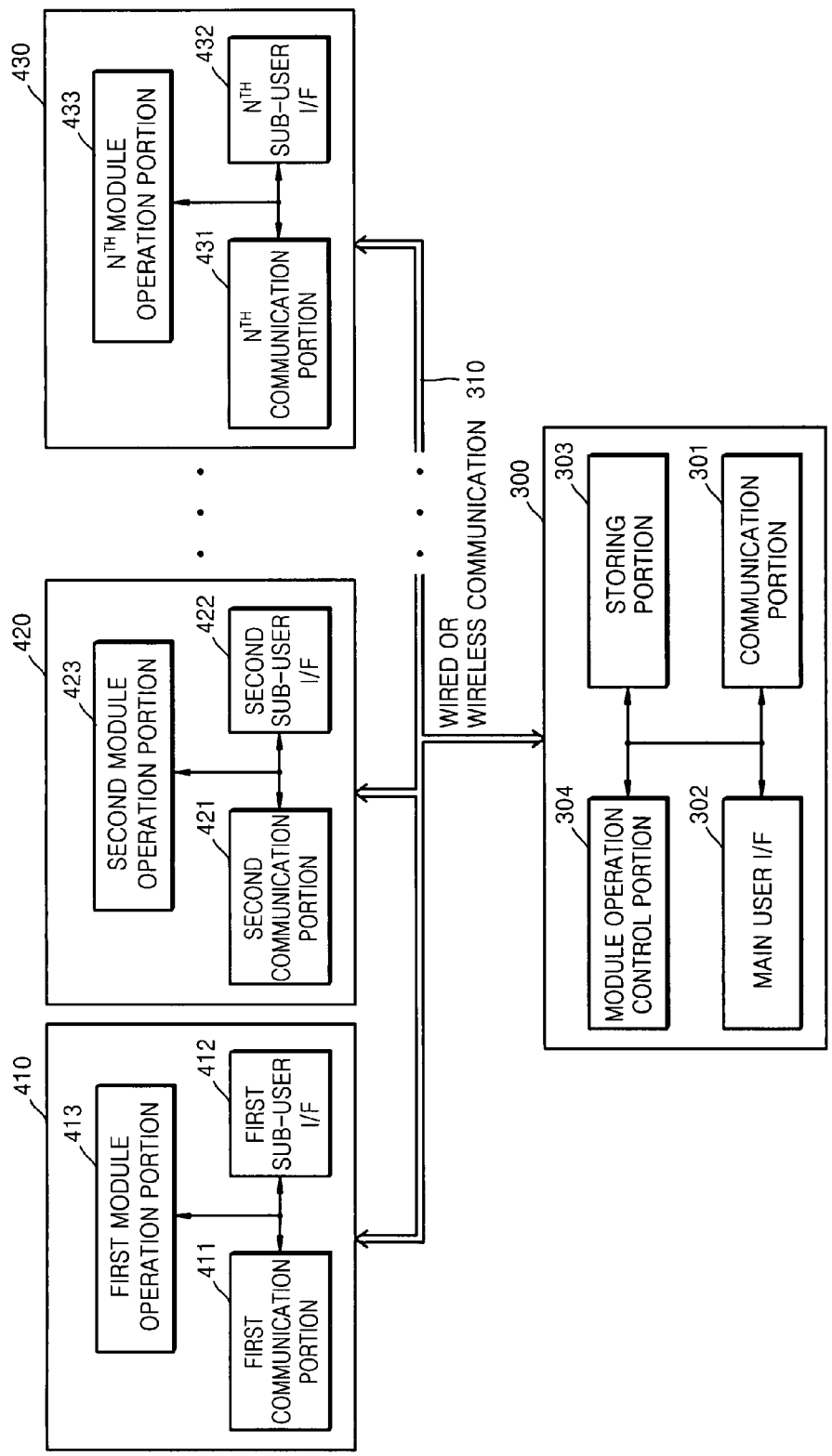
FIG. 3 is a block diagram illustrating the configuration of a control system of a plurality of chip mounters according to an embodiment of the present invention.
Figure 7:
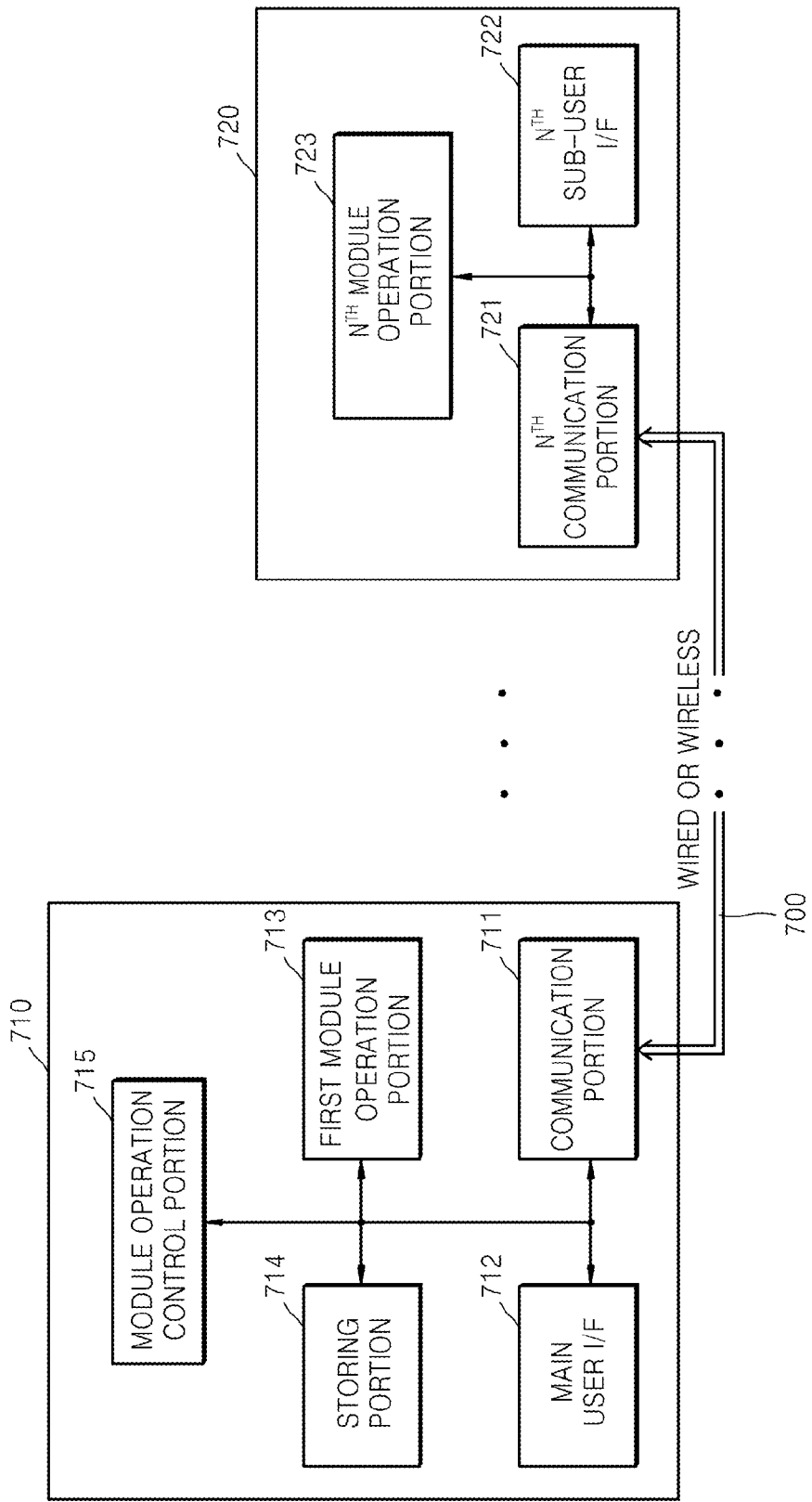
FIG. 7 is a block diagram illustrating the configuration of a control system of a plurality of chip mounters according to another embodiment of the present invention.

Two exemplary embodiments according to the present invention will now be described to provide a control system for a plurality of chip mounters. In a first embodiment, as shown in FIG. 3, a control device capable of controlling a plurality of chip mounters is separately provided to control the chip mounters. In a second embodiment, as shown in FIG. 7, any one of the chip mounters includes a module capable of controlling the other chip mounters.

The first exemplary embodiment according to the present invention is described with reference to FIG. 3. FIG. 3 is a block diagram illustrating the configuration of a control system of a plurality of chip mounters. The control system according to the present embodiment includes a control device 300, a communication device 310, a first chip mounter 410, a second chip mounter 420, and an $N^{th}$ chip mounter 430. The control device 300 includes a communication portion 301, a main user interface (I/F) 302, a storing portion 303, and a module operation control portion 304. In the present embodiment, the first chip mounter 410 includes a first communication portion 411, a first sub-user interface (I/F) 412, and a first module operation portion 413. The second chip mounter 420 includes a second communication portion 421, a second sub-user interface (I/F) 422, and a second module operation portion 423. The $N^{th}$ chip mounter 430 includes an $N^{th}$ communication portion 431, an $N^{th}$ sub-user interface (I/F) 432, and an $N^{th}$ module operation portion 433.

Although each chip mounter is capable of independently operating according to the conventional technology, in the present invention, the chip mounters 410, 420, and 430 are passively operated integrally under control of the control device 300. The communication device 310 provides data communication between the control device 300 and the chip mounters 410, 420, and 430 by connecting the control device 300 and the chip mounters 410, 420, and 430 with a wire or wirelessly.

For a wired data communication, the communication device 310 may be an Ethernet. For a wireless data communication, communication may be performed using an Ethernet according to the IEEE 802.3 standard. The Ethernet adopts a CSMA/CD (carrier sense multiple access/collision detection) method and provides communication between the control device 300 and the chip mounters 410, 420, and 430. Although there is a token ring method alternative to the competition method, in the present invention, the CSMA/CD method that is used may be a basic method in the Ethernet. Presently, the speed of the Ethernet has reached 100 Mbps beyond 10 Mbps, and a giga-Ethernet is used when wire communication is performed. The control device 300 can integrally manage a plurality of chip mounters 410, 420 and 430 in real time using the giga-Ethernet.

When wireless communication is performed, the communication device 310 can be, for example, a Zigbee. The Zigbee operates according to one of the IEEE 802.15.4 standards supporting communication and technology for ubiquitous computing and short distance communication (e.g., about 10-20 meters) in the wireless networking field for home and office. That is, the Zigbee is a concept for a mobile phone or wireless LAN and communicates a small amount of information while minimizing power consumption unlike the conventional technology. The Zigbee is commonly used for intelligent home networks, short distance communication such as in buildings and for automation of industrial machine, logistics, environmental monitoring, human interface, telematics, and military affairs. Also, the Zigbee generally is small, consumes low power, and is inexpensive, thereby providing a solution for ubiquitous building such as a home network.

The control device 300 integrally controlling the operation of the chip mounters 410, 420, and 430, e,g., part installation devices, includes the communication portion 301, the main user interface (I/F) 302, the storing portion 303, and the module operation control portion 304. The communication portion 301 provides data communication via the wire or wireless communication device 310 under control of the module operation control portion 304. The communication portion 301 transmits an operation control signal to the chip mounters 410, 420, and 430 under control of the module operation control portion 304 and receives an operation status signal and a data request signal from the chip mounters 410, 420, and 430.

The main user interface 302 includes an input unit used by a user to input a work order, and a display unit capable of displaying the operation status of the control device 300 and the chip mounters 410, 420, and 430. When the work order for operating the chip mounters 410, 420, and 430 is input through the input unit, the module operation control portion 304 operates the chip mounters 410, 420, and 430 through the communication portion 301 according to the work order and the operation status of the chip mounters 410, 420, and 430 is displayed through the display unit.

The storing portion 303 stores various information for the operation of the chip mounters 410, 420, and 430. The module operation control portion 304 can perform control by accessing the storing portion 303 to share the information about the chip mounters 410, 420, and 430. The storing portion 303 stores, for example, the types of parts, part size information, part suction information, part installation information, and part handling information. Also, the storing portion 303 stores in real time the stock amount of parts kept by the chip mounters 410, 420, and 430, the status information of part supply units 44a and 44b (see FIG. 4), and the information about installed parts.

The module operation control portion 304 generates operation control signals for the chip mounters 410, 420, and 430 through the chip mounter work order input through the main user interface 302, various information stored in the storing portion 303, and chip mount monitoring information. The operation control signal generated by the module operation control portion 304 is transmitted to the chip mounters 410 or/and 420 or/and 430 through the communication device 310 and the chip mounter 410 or/and 420 or/and 430 receiving the operation control signal perform the operation corresponding to the operation control signal.

The first chip mounter 410 for mounting parts on a printed circuit board PCB (not shown) includes the first communication portion 411, the first sub-user interface 412, and the first module operation portion 413. The $N^{th}$ chip mounter 430 for mounting parts on the PCB includes the $N^{th}$ communication portion 431, the $N^{th}$ sub-user interface 432, and the $N^{th}$ module operation portion 433.

The first, second, and $N^{th}$ chip mounters 410, 420, and 430 are not independently operated but passively operated according to the operation control signal of the module operation control portion 304. The first, second, and $N^{th}$ communication portions 411, 421, and 431 provide data communications via the wire or wireless communication device 310. The first, second, and $N^{th}$ communication portions 411, 421, and 431 transmit signals to the control device 300 at the request of the module operation control portion 304 and receive the operation control signals from the module operation control portion 304 to transmit the received signals to corresponding blocks.

The first, second, and $N^{th}$ sub-user interfaces 412, 422, and 432 display information needed for the operation of the first, second, and $N^{th}$ chip mounters 410, 420, and 430 or error situations such as an alarm which can be simply cleared with the input of information by a worker. The first, second, and $N^{th}$ module operation portions 413, 423, and 433 are operated by receiving the operation control signal from the module operation control portion 314 through the communication device 310.

Figure 4:
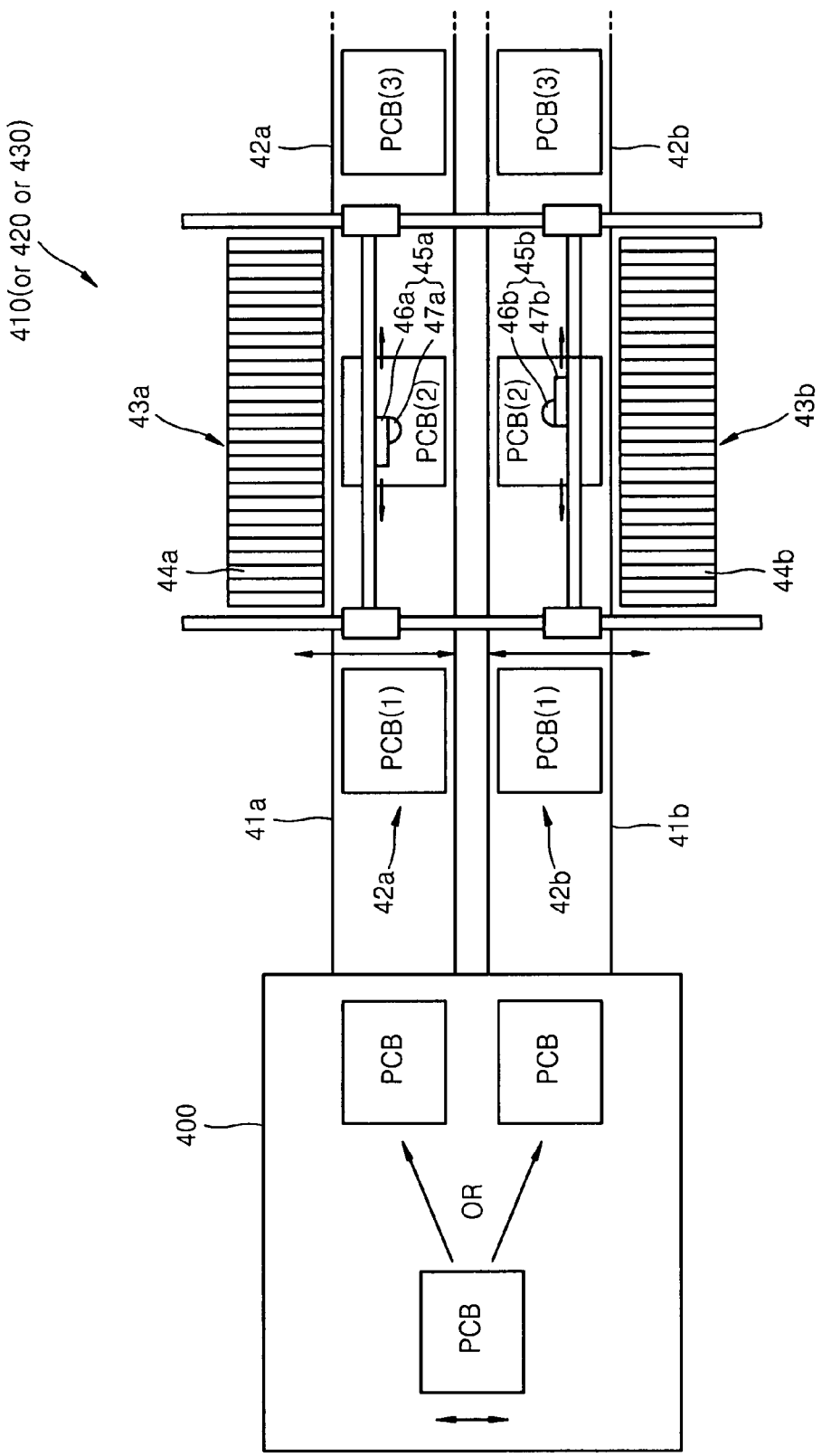
FIG. 4 illustrates the module operation unit and peripheral devices of the chip mounters of FIG. 3.

FIG. 4 illustrates the module operation portion and peripheral devices of the chip mounters 410, 420, and 430 of FIG. 3. Referring to FIG. 4, the module operation portion and peripheral devices of the chip mounters 410, 420, and 430 include a PCB supply unit 400 and the chip mounters 410, 420, and 430. The PCB supply unit 400 may include a motor (not shown). As the motor moves, a PCB is supplied to a dual lane path (a first lane 41a and a second lane 41b). Transfer units 42a and 42b transfer the PCBs to the dual lane 41a and 41b through the PCB supply unit 400. Part supply units 43a and 43b include a plurality of part feeders 44a and 44b to supply selected parts. Head units 45a and 45b respectively include mounting heads 47a and 47b having suction nozzles 46a and 46b, and mount the parts sucked and picked up by the suction nozzles 46a and 46b onto the PCB.

In FIG. 4, a PCB(1) put on the dual lane 41a and 41b is transferred to a mounting position. Parts are mounted by the head units 45a and 45b on a PCB(2) that is transferred to the mounting position in a stop state. A PCB(3) where the parts are mounted is transferred to the dual lanes 42a and 42b.

Figure 5:
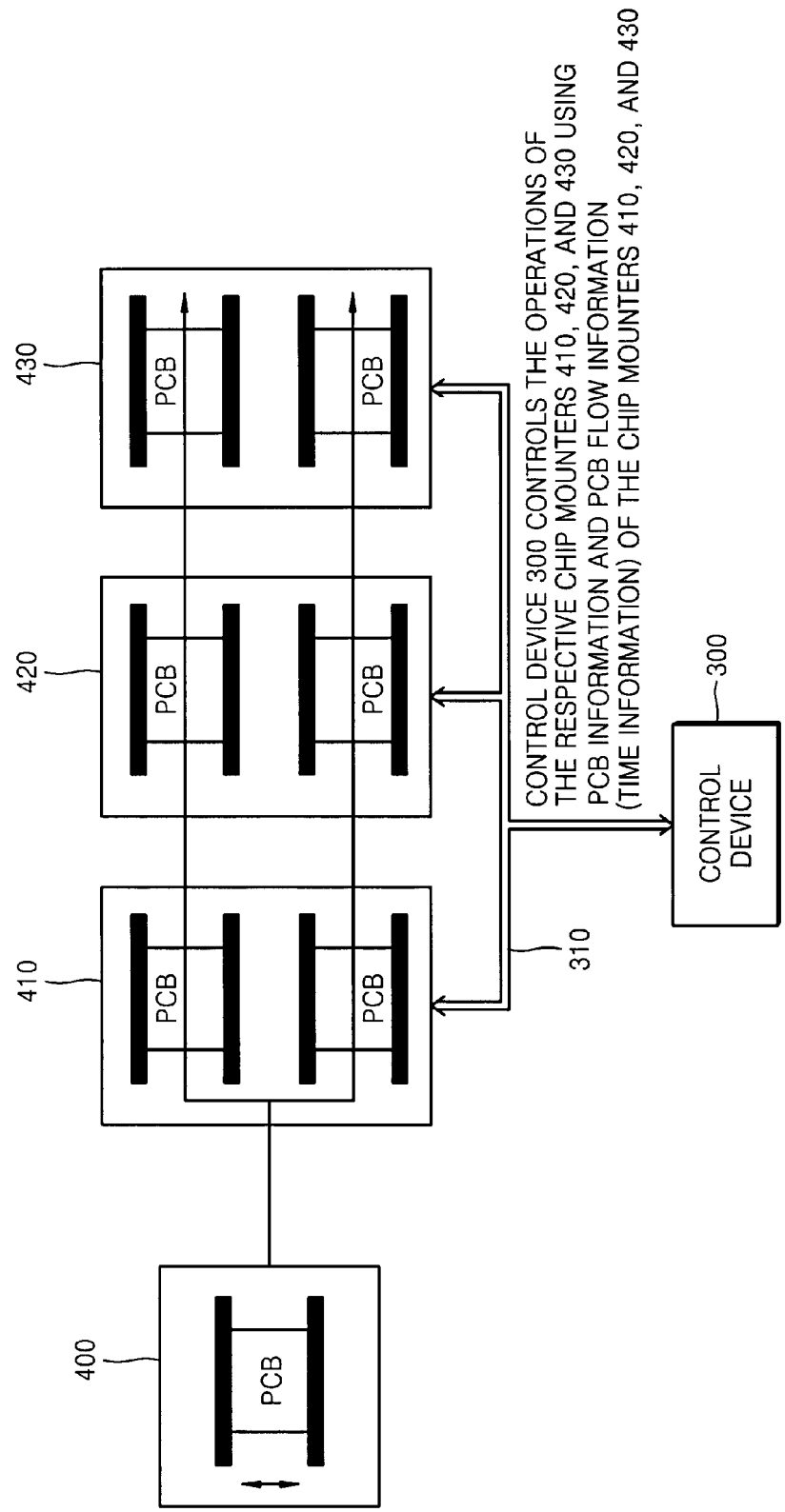
FIG. 5 illustrates in detail the operation of the module operation unit and peripheral devices of FIG. 4.

FIG. 5 illustrates in detail the operation of the module operation portion and peripheral devices of FIG. 4. Referring to FIG. 5, the control device 300 receives and stores the PCB information and PCB flow information from the chip mounters 410, 420, and 430 through the communication device 310. The control device 300 respectively or integrally controls the chip mounters 410, 420, and 430 using the PCB information and PCB flow information.

When installing parts on a PCB, the chip mounters 410, 420, and 430 search for a predetermined reference point, calculate from the reference point a relative position where parts are installed, and accurately determine the position where the part is installed on the PCB. Since the conventional chip mounters are independently driven, before installing the part, each chip mounter always checks the reference point to determine the accurate position where the part is installed. However, in the present invention, the control device 300 searches for the reference point on the PCB through a one-time search operation and accordingly provides the part installation position to the chip mounters 410, 420, and 430, thus saving the time for each of the chip mounters 410, 420, and 430 to search for the reference point. In addition to the reference point, the control device 300 searches for a "Bad" mark and an "Accept" mark for determining the quality of the PCB and provides the searched marks to the chip mounters 410, 420, and 430, thereby saving the time for each of the chip mounters 410, 420, and 430 to search for the "Bad" mark and the "Accept" mark.

The control device 300 monitors the operations of the chip mounters 410, 420, and 430 through the communication device 310 and performs line balancing through working part automatic arrangement according to the structural conditions and working conditions of the chip mounters 410, 420, and 430. Since the conventional chip mounters are independently driven, a bottle neck phenomenon may occur such as due to a supply part depletion, a vision error, discontinuation of PCB supply, or when an equipment error occurs. Thus, the operations of other chip mounters are stopped so that the overall production amount may be reduced. However, in the present embodiment, the line balancing is performed through the real time working part automatic arrangement according to the structural conditions and working conditions of all of the chip mounters 410, 420, and 430 so that the bottle neck phenomenon is avoided.

For example, when the stock amount of the part installed on the PCB in the first chip mounter 410 is insufficient, the control device 300 detects the insufficient stock amount and searches for the chip mounter 420 or 430 having a sufficient stock amount of the same parts. When the stock amount of the insufficient part is sufficient in the $N^{th}$ chip mounter 430, as a result of the search by the control device 300, the control device 300 transmits operation control signals to the first chip mounter 410 through the $(N-1)^{th}$ chip mounter (not shown) to stop the installation of the part and transmits an operation control signal to the $N^{th}$ chip mounter 430 to perform the installation of the part. As the line balancing is performed through the real time automatic arrangement of the working part according to the working conditions, the amount of production can be increased.

A conventional SMT (surface mount technology) line system performs basic communications among the respective devices according to a SMEMA (Surface Mount Equipment Manufacturers Association) interface standard to control the flow of PCBs. However, in the present embodiment, since the control device 300 monitors the positions of the PCBs of the chip mounters 410, 420, and 430 and transmits the operation control signal to the chip mounters 410, 420, and 430, the chip mounters 410, 420, and 430 control the flow of the PCBs according to the operation control signals, and the control device 300 replaces the SMEMA interface function so that the flow of the PCBs can be more efficiently controlled.

The control device 300 monitors work loads of the chip mounters 410, 420, and 430 and evaluates the effect on overall work time when any of the chip mounters 410, 420, and 430 are stopped. The control device 300 displays the evaluation on the main user interface 302 of FIG. 3. Thus, the chip mounter 410, 420, or 430 that is stopped can be checked.

The control device 300 monitors the operation status of the chip mounters 410, 420, and 430. When the job change is to occur, the control device 300 informs a user through the main user interface 302 of FIG. 3 so that a new job can be performed without stopping the operations of the chip mounters 410, 420, and 430.

FIGS. 6A through 6D illustrate the job change operation of the chip mounters 410, 420, and 430 shown in FIGS. 3 and 4. The job change means that the present job is completed and a new job is performed. For the conventional chip mounter, a worker must stop the chip mounter. After setting up the chip mounter for the new job, the conventional chip mounter is restarted to perform the new job so that a lot of working time is needed.

However, in the present embodiment, the control device 300 monitors a job change of the chip mounters 410, 420, or 430 and notifies a user of the result. The control device 300 can continually be operated with new operation circumstances without stopping the operations of the chip mounters 410, 420, or 430.

For this purpose, as shown in FIG. 6A, it is assumed that a job for producing $PCB_1$ is presently performed. A work environment for $PCB_1$ may include, for example, the width of the dual lane 41a and 41b, and docking cart and feeder information for the production of the $PCB_1$. In particular, since the production completion time of the $PCB_1$ can be known, the job change time can be automatically set. When the job change time occurs, as shown in FIG. 6B, while the first lane 41a produces the $PCB_1$, the second lane 41b is set up for a new working environment, for example, the feeder is replaced and the lane width is set to produce the $PCB_2$. Then, as shown in FIG. 6C, at the time when the production of the $PCB_1$ in the first lane 41a is completed, the production of the $PCB_2$ begins in the second lane 41b. While the $PCB_2$ is produced in the second lane 41b, the first lane 41a is set up for a new working environment, for example, the feeder is replaced and the lane width is set to produce the $PCB_2$. When the production of the $PCB_1$ is completed, since the production of the $PCB_2$ can begin without stopping the operation of the chip mounters 410, 420, and 430, the working time and the number of working steps can be reduced.

FIG. 7 is a block diagram illustrating the configuration of a control system of a plurality of chip mounters according to another exemplary embodiment of the present invention. Referring to FIG. 7, the control system according to another present embodiment includes a communication device 700, a first chip mounter 710, and a $N^{th}$ chip mounter 720. The first chip mounter 710 performs the main chip mounter and includes a communication portion 711, a main user interface 712, a first module operation portion 713, a storing portion 714, and a module operation control portion 715. The $N^{th}$ chip mounter 720 includes an $N^{th}$ communication portion 721, the $N^{th}$ sub-user interface 722, and the $N^{th}$ module operation portion 723.

The main user interface 712 performs the operation similar to the first sub-user interface 412 shown in FIG. 3. Since the first embodiment shown in FIG. 3, and the second embodiment shown in FIG. 7 are same in the operation as shown in FIG. 3, but different from each other as to whether the control device 300 is provided independently or included in any one chip mounter, the detailed description thereof is the same and will not be repeated herein.

As described above, according to the present invention, since the chip mounters which are conventionally independently driven are integrally controlled by a single device, the respective chip mounters are efficiently managed so that productivity can be improved.

While the present invention has been particularly shown and described with reference to exemplary embodiments thereof, it would be understood by those skilled in the art that various changes in form and details may be made therein without departing from the spirit and scope of the invention as defined by the appended claims. The exemplary embodiments should be considered in descriptive sense only and not for purposes of limitation. Therefore, the scope of the invention is defined not by the detailed description of the invention but by the appended claims, and all differences within the scope will be construed as being included in the present invention.

What is claimed is:

1. A control system comprising:
   at least two part mounters adapted for installing parts on a printed circuit board transferred on one of at least two lanes; and
   a control device for integrally controlling the operation of the at least one part mounter;
   wherein the control device automatically arranges working parts in real time according to structural conditions and working conditions of at least one of the at least two part mounters so that a bottle neck phenomenon is avoided;
   the control system further comprising
   a communication device for performing data communications by connecting the at least one part mounter and the control device with a wire or wirelessly;
   wherein the control device searches a first part mounter for a positioning mark determining a position-based reference point on the printed circuit board and a part installation position on the printed circuit board and supplies position-based search information to other part mounters; and
   wherein the control device sets-up a next work order on the at least one part mounter performing a present work order and controls the next work order without stopping the part mounters when the present work order of the part mounters is complete.

2. The control system of claim 1, wherein the at least two part mounters comprise:
   a module operation portion for performing a part mounting operation according to an operation command transmitted from the control device through the communication device; and
   a user interface for inputting a work order to the part mounter and displaying an operation situation of the part mounter.

3. The control system of claim 1, wherein the control device comprises:
   a user interface for inputting a work order to the part mounter and displaying an operation situation of the part mounters;
   a storing portion for storing information on parts installed by the part mounters, information on a feeder that supplies the parts, and information on arrangement of the parts on the printed circuit board; and
   a module operation control portion for controlling operation of the at least two part mounters using information received through the user interface and the information stored in the storing portion.

4. The control system of claim 3, wherein the control device stops installation of a part whose stock amount is depleted in a first part mounter and starts installation of the part whose stock is not depleted in another part mounter.

5. The control system of claim 1, wherein the control device monitors a position of the printed circuit board provided in the at least two part mounters to control positional movement of the printed circuit board.

6. The control system according to claim 1, wherein the bottle neck phenomenon is selected from the group consisting of a supply part depletion, a vision error, discontinuation of PCB supply, and a part mount error.

7. The control system according to claim 1, wherein the search information further comprises a "bad" mark that identifies an unacceptable board that should not be used, and an "accept" mark that identifies an acceptable board that should be used, the marks thereby determining a quality of the printed circuit board.

8. At least two part mounters adapted for installing parts on a printed circuit board transferred on one of at least two lanes, the at least two part mounters comprising:
   a main part mounter, the main part mounter comprising an integrated mounter operation control portion; and
   one or more other part mounters;
   wherein the main part mounter controls other part mounters via the integrated mounter operation control portion by automatically arranging working parts in real time according to structural conditions and working conditions of the other part mounters so that a bottle neck phenomenon is avoided;
   wherein the main part mounter sets-up a next work order on any one part mounter performing a present work order and controls the next work order without stopping the one part mounter when the present work order is complete.

9. The at least two part mounters of claim 8, wherein the main part mounter comprises:
   a module operation portion for performing a part mounting operation according to an operation command transmitted from the main part mounter through the communication device; and
   a user interface for inputting a work order to the main part mounter and displaying operation situation of the part mounter.

10. The at least two part mourners of claim 8, wherein the main part mounter comprises:
    a user interface for inputting a work order to the part mounter and displaying an operation situation of the part mounter;
    a storing portion for storing information on parts installed by the part mounter, information on a feeder that supplies the parts, and information on arrangement of the parts on the printed circuit board; and
    a module operation control portion for controlling operation of the main part mounter using information received through the user interface and the information stored in the storing portion.

11. The at least two part mounters of claim 8, wherein the main part mounter searches for a positioning mark determining a reference point on the printed circuit board and a part installation position on the printed circuit board and supplies position-based search information to the other part mounters.

12. The at least two part mounters of claim 8, wherein the main part mounter stops the installation of the part whose stock amount is depleted in any one part mounter and starts another part mounter having an undepleted stock amount of the part.

13. The at least two part mounters of claim 8, wherein the main part mounter monitors a position of the printed circuit board to control positional movement of the printed circuit board.

14. A method of integrally controlling operations of a plurality of part mounters installing parts on a printed circuit board transferred on one of at least two lanes, using a control device that integrally controls the operations of the plurality of part mounters, the method comprising:

receiving and storing information on parts that the plurality of part mounters install, information on a feeder that supplies the parts, and information on arrangement of the parts on the printed circuit board;

receiving and displaying operation information and operation situations from the plurality of part mounters;

arranging automatically working parts in real time according to structural conditions and working conditions of at least one part mounter of the plurality of part mounters so that a bottle neck phenomenon is avoided using the stored information and displayed information;

searching, by the control device, a first part mounter for a positioning mark determining a position-based reference point on the printed circuit board and a part installation position on the printed circuit board;

supplying the position-based search information to other part mounters; and setting up, by the control device, a next work order on the at least one part mounter performing a present work order and controls the next work order without stopping the part mounters when the present work order of the part mounters is complete.

15. A method of integrally controlling operations of a plurality of part mounters installing parts on a printed circuit board transferred on one of at least two lanes, using one of the part mounters to integrally control the operations of other part mounters, the method comprising:

receiving and storing information on parts that the plurality of part mounters install, information on a feeder that supplies the parts, and information on arrangement of the parts on the printed circuit board;

receiving and displaying operation information and operation situations from the other part mounters;

arranging automatically working parts in real time according to structural conditions and working conditions of at least one part mounter of the plurality of part mounters so that a bottle neck phenomenon is avoided using the stored information and displayed information;

searching, by the control device, a first part mounter for a positioning mark determining a position-based reference point on the printed circuit board and a part installation position on the printed circuit board;

supplying the position-based search information to other part mounters; and setting up, by the control device, a next work order on the at least one part mounter performing a present work order and controls the next work order without stopping the part mounters when the present work order of the part mounters is complete.

16. A surface mount technology line comprising:

a first part mounter for installing parts on a printed circuit board transferred on one of at least two lanes;

a second part mounter for installing parts on the printed circuit board transferred on one of at least two lanes; and a control device integrating parts installation control of the first and second part mounters, wherein the control device automatically arranges working parts in real time according to structural conditions and working conditions of the first part mounter and the second part mounter so that a bottle neck phenomenon is avoided the control device further comprising a communication device for performing data communications by connecting the at least one part mounter and the control device with a wire or wirelessly;

wherein the control device searches a first part mounter for a positioning mark determining a position-based reference point on the printed circuit board and a part installation position on the printed circuit board and supplies position-based search information to other part mounters;

wherein the control device sets-up a next work order on the at least one part mounter performing a present work order and controls the next work order without stopping the part mounters when the present work order of the part mounters is complete.

17. The surface mount technology line of claim 16, further comprising:

a communication device coupling the first and second part mounters and conveying the parts installation control with the control device.

18. The surface mount technology line of claim 17, wherein the communication device comprises a wireless communication device.

19. The surface mount technology line of claim 16, wherein the first part mounter includes the control device.

* * * * *